United States Patent
Kawamata et al.

[11] Patent Number: 5,142,147
[45] Date of Patent: Aug. 25, 1992

[54] IMAGE PROCESSING DEVICE FOR AN ELECTRON MICROSCOPE

[75] Inventors: Shigeru Kawamata, Ibaraki; Tomoyasu Hirashima, Hitachiota, both of Japan

[73] Assignee: Hitachi Naka Seiki, Ltd., Japan

[21] Appl. No.: 624,564

[22] Filed: Dec. 10, 1990

[30] Foreign Application Priority Data

Dec. 19, 1989 [JP] Japan .................. 1-327440

[51] Int. Cl.⁵ .............................. H01J 37/26
[52] U.S. Cl. ...................... 250/310; 250/397
[58] Field of Search ............ 250/310, 311, 397

[56] References Cited

U.S. PATENT DOCUMENTS 4,866,273 9/1989 Kobayashi et al. ............... 250/310
4,907,287 3/1990 Homma et al. ................... 250/397

FOREIGN PATENT DOCUMENTS 61-135034 12/1984 Japan .
62-285582 12/1987 Japan .

*Primary Examiner*—Bruce C. Anderson
*Attorney, Agent, or Firm*—Antonelli, Terry, Stout & Kraus

[57] ABSTRACT

The present invention discloses an image processing device for an electron microscope intending to improve the image quality by subjecting image data $D_t$ to interframe integration, comprising means for detecting at least either one of variations of said image data $D_t$ in 1 frame unit and modifications in the observation condition of the electron microscope; a frame memory storing image data $\int D_t$ after the integration subjected to the interframe integration; integrating means for executing the interframe integration with a degree of integration corresponding to at least either one of the variations and the modifications between the image data $D_t$ and the image data $\int D_i$ after the integration and storing the image data after the integration in the frame memory as new image data $\int D_t$ after the integration; and means for displaying the image data $\int D_t$ after the integration as an observed image. By using the construction described above it is possible to provide an image processing device for an electron microscope, which can make the property of following variations and the effect of improving the image quality compatible, because the degree of integration is decreased automatically, in the case where the property of following variations is expected rather than the effect of improving the image quality, when there are variations in the image data in 1 frame unit or modifications in the observation condition of the electron microscope.

4 Claims, 4 Drawing Sheets

IMAGE PROCESSING DEVICE FOR AN ELECTRON MICROSCOPE

BACKGROUND OF THE INVENTION

The present invention relates to an image processing device for processing an image observed by means of an electron microscope, and in particular to an image processing device capable of reducing noise in the observed image and improving the image quality.

With respect to the improvement of the image quality based on image signals detected by using a television camera, as described e.g. in JP-A-Sho 62-285582, a technique has been proposed by which image signals coming from the camera are integrated over a specified number of frames to reduce random noise.

Further, as another technique similar to that described above as applied to an electron microscope there is described in JP-A-Sho 61-135034, a technique by which a difference between a detection signal for secondary electrons, etc. emitted by a sample irradiated with an electron beam and a signal stored in an image memory is obtained and an attempt is made to improve the image quality by integrating and storing the detection signal in the image memory on the basis of an address relation, when the difference is smallest.

For improvement of the image detected by a television camera or a detector of an electron microscope, when detection signals are stored once in an image memory as image data, a so-called interframe integration is widely utilized, by which the same portion on a sample is scanned a plurality of times; image data based on this scanning effected a plurality of times is integrated in the image memory; and the observed image is displayed on the basis of this integrated data.

With respect to the interframe integration, whose object is to reduce noise, various methods have been proposed. The have both merits and demerits. However, for a scanning electron microscope, a cyclic digital integrating circuit is widely utilized, because many memories are not required and the construction thereof is relatively simple.

A cyclic digital integrating circuit works according to a method by which, as indicated in FIG. 8, an attenuation coefficient N for an input signal $D_t$ is previously set according to a noise suppression amount; an input signal attenuated by 1/N and an output signal $\int D_{t-1}$ of the image memory, which is attenuated by (1−1/N), are added; and the data after the addition is outputted as the image signal $\int D_t$ and at the same time is stored again in the image memory as the image data after the integration.

In the following explanation, the case where the attenuation coefficient N is great so that the output signal $\int D_{t-1}$ has a priority to the input signal $D_t$ is described as a case where "the degree of integration is great" and on the contrary, the case where the attenuation coefficient N is small so that the input signal $D_t$ has a priority to the output signal $\int D_{t-1}$ is described as a case where "the degree of integration is small", and the inverse 1/N of the attenuation coefficient N is expressed sometimes by a k value.

When the prior art technique described above is applied to a scanning electron microscope, if the attenuation coefficient N is great so that the degree of integration is great, although the S/N ratio increases and the image quality is improved, the property of following variations in the detected signal becomes worse.

Concretely speaking, even if variations in the detected signal for the observed image are produced due to displacement of the sample, a change in the magnifying power, a modification in the condition of the electron beam, etc., the observed image after the changes is not displayed immediately, but the observed image before the changes remains as an after image.

On the contrary, if the attenuation coefficient N is small so that the degree of integration is small, although the property of the following variations is improved, the effect of improving the image quality becomes smaller.

As described above, it is difficult to make the property of the following variations and the effect of improving the image quality compatible. By the prior art technique, an operator operates the device so that when the observed image doesn't vary and variations in the detection signal for the observed image are small, the degree of integration is great in order that the increase in the S/N ratio has a priority to the property of the following variations, and on the contrary, when variations in the detection signal are great, the degree of integration is small in order that the property of the following variations has a priority to the increase in the S/N ratio. Therefore, there was a problem that the operation is complicated.

SUMMARY OF THE INVENTION

The object of the present invention is to provide an image processing device which is capable of solving the problems described above, which can follow variations in the observation condition, when they are produced, and has a high effect of improving the image quality at the time of usual observation.

In order to solve the problems described above, an image processing device for a scanning electron microscope according to the present invention, in which image data are subjected to an interframe integration to improve the image quality, comprises means for detecting at least one of variations of the image data in 1 frame unit and modifications in the observation condition for the scanning electron microscope; a frame memory storing the image data $\int D_{t-1}$ after the integration, subjected to an interframe integration; integrating means, which executes the interframe integration with a degree of integration, responding to at least one of the variations and the modifications described above, between the image data $D_t$ and the image data $\int D_{t-1}$ after the integration and stores the image data after the integration in the frame memory as new image data $\int D_t$ after the integration; and means for displaying the image data $\int D_t$ after the integration as an observed image.

By the construction described above, in the case where variations are produced in the image data in 1 frame unit or there are modifications in the observation condition for the electron microscope and thus the property of following variations is expected rather than the effect of improving the image quality, the degree of integration is reduced automatically.

On the contrary, where neither the image data nor the observation condition for the electron microscope are changed and thus the effect of improving the image quality is expected rather than the property of following variations, the degree of integration is increased automatically. In this way it is possible to provide an image processing device for a scanning electron microscope by which the property of following variations and the effect of improving the image quality are made compatible.

As clearly seen from the above description, the following effects can be obtained by the present invention.

That is, since the degree of integration is reduced automatically, in the case where variations are produced in the image data in 1 frame unit or there are modifications in the observation condition for the electron microscope and thus the property of following variations is expected rather than the effect of improving the image quality, and on the contrary the degree of integration is increased automatically, in the case where neither the image data nor the observation condition for the electron microscope are changed and thus the effect of improving the image quality is expected rather than the property of following variations, it is possible to provide an image processing device for a scanning electron microscope by which the property of following variations and the effect of improving the image quality are made compatible.

DESCRIPTION OF THE PREFERRED EMBODIMENTS

Figure 1:
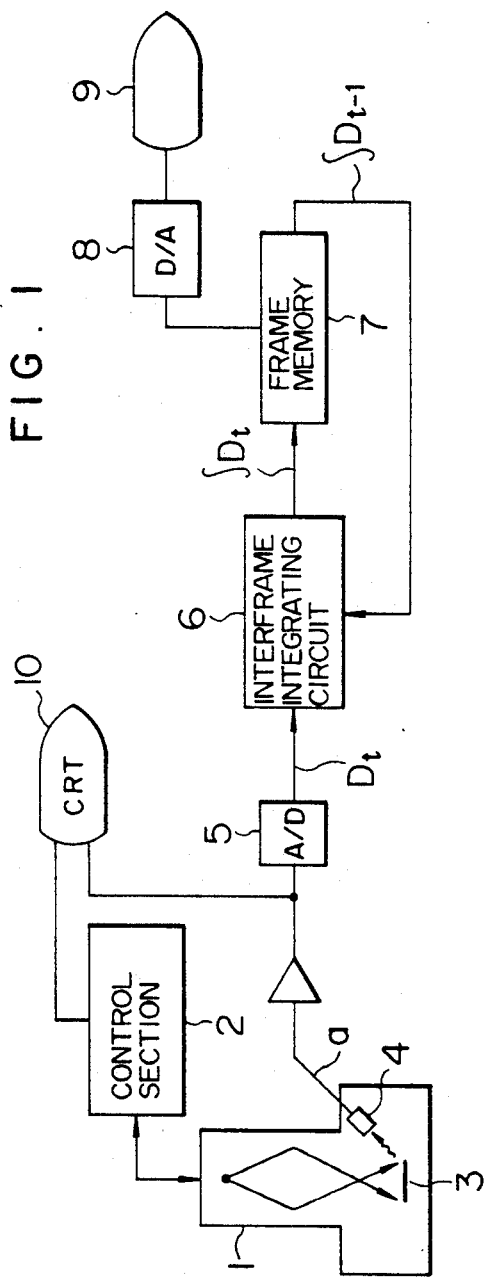
FIG. 1 is a block diagram of an image processing device, which is a first embodiment of the present invention.

Hereinbelow the present invention will be explained in detail, referring to the drawings.

FIG. 1 is a block diagram of an image processing device for a scanning electron microscope, which is an embodiment of the present invention, in which sample observation conditions such as magnifying power of the scanning electron microscope 1, the diaphragm for the condenser lens, correction of astigmatism, displacement of the sample stage, scanning speed, gamma correction, focus adjustment, the irradiation condition with an electron beam, etc. as well as the sensitivity of a detector 4, are controlled by a control section 2.

The sample 3 is scanned two-dimensionally with the electron beam and secondary signals, such as secondary electrons, back scattered electrons, etc. emitted by the sample 3 are detected by the detector 4. A detection signal a obtained by the detector 4 is inputted to an observation CRT 10 after having been amplified by an amplifier. In the observation CRT 10 deflection sweeping, is effected in synchronism with the scanning of the electron beam so that an observation image of the sample is displayed.

Further the detection signal a amplified by the amplifier is inputted in an interframe integrating circuit 6 after having been converted into digital image data $D_t$ by an A/D converter 5. The interframe integrating circuit 6 executes an interframe integration, using the image data $D_t$ and the image data $\int D_{t-1}$ after the integration for the immediately preceding frame, outputted by the frame memory 7, described later, and inputs the image data after the integration to the frame memory 7 as new image data $\int D_t$ after the integration.

The image data in the frame memory 7 is converted successively into analogue signals by a D/A converter 8 and displayed on a monitor 9. The period of the display of the observed image on the monitor 9 may or may not be in synchronism with the scanning period for the scanning electron microscope 1. That is regardless of the scanning speed of the scanning electron microscope 1, it is possible to display the observation image as a still image on the monitor 9 by using a high display speed for the monitor 9.

Figure 2:
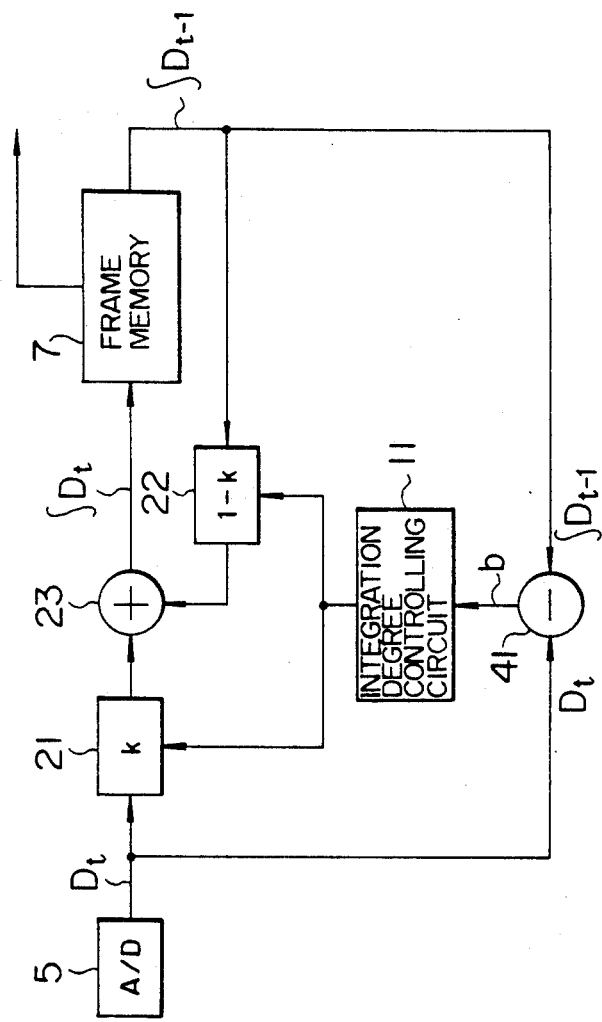
FIG. 2 is a block diagram of an interframe integrating circuit indicated in FIG. 1.

FIG. 2 is a block diagram indicating the construction of the interframe integrating circuit 6 described above.

In the figure, a subtracter 41 executes a subtraction between the digital image data $D_t$ and the image data $\int D_{t-1}$ after the integration for the immediately preceding frame outputted by the frame memory 7 to output the difference signal b thus obtained to an integration degree controlling circuit 11.

The relation between the integral value $\int b$ obtained by integrating the difference signal b over a certain period and the coefficient k determining the degree of integration at that time is previously registered in the integration degree controlling circuit 11 in the form of a data table. In practical control the integration degree controlling circuit 11 executes the control so that the value of the coefficient k is increased in order to decrease the degree of integration, in the case where the integral value $\int b$ is great, and it is decreased in order to increase the degree of integration, in the case where the integral value $\int b$ is small, while applying the integral value $\int b$ thus obtained to the data table.

The image data $D_t$ outputted by the A/D converter 5 is attenuated with a gain of k in an attenuator 21 and the image data $\int D_{t-1}$ after the integration for the immediately preceding frame outputted by the frame memory 7 is attenuated with a gain of $(1-k)$ in another attenuator 22.

$k \cdot D_t$ and $(1-k) \cdot \int D_{t-1}$ described above are added to each other and the data after the addition is registered in the frame memory 7 as new image data $\int D_t$ after the integration and at the same time is outputted to the D/A converter 8 as the image data at that time.

As the result, the image data $\int D_t$ after the integration and the image data $D_t$ has a following relationship:

$$\int D_t = k \cdot D_t + (1-k) \cdot \int D_{t-1}$$
$$= k \cdot D_t + (1-k) \cdot k \cdot D_{t-1} + k(1-k)^2 \cdot D_{t-2} + \ldots$$

The coefficient k determining the degree of integration has a value from 0 to 1, and if this value is small, although the effect of reducing noise is great, the property of following variations is reduced, while if the value is great, although the effect of reducing noise is small, the property of following variations is increased. If $k=1$, no interframe integration is effected, and thus the input signal is outputted as it is so that the image quality is not improved.

Further it is preferable that the integration period for obtaining the integral value ∫b described above, i.e. the number of frames therefor, has such an order of magnitude that erroneous detections due to noise are canceled therewith. In addition, it is preferable that the data table is registered with such a step that the improvement of the image quality is effected therewith without giving any unnatural feeling.

Figure 3:
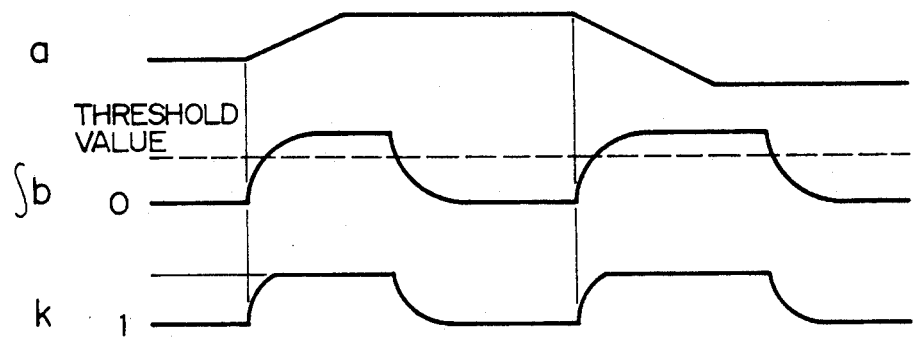
FIG. 3 is a scheme for explaining the function of the circuit indicated in FIG. 2.

FIG. 3 is a scheme showing the relation among the detection signal a obtained by the detector 4, the integral value ∫b and the coefficient k controlled, depending on variations in the integral value ∫b.

When the detection signal a varies and the integral value ∫b increases, the coefficient k increases gradually and until the integral value ∫b exceeds a certain threshold value, there is an approximately proportional relationship therebetween. When the integral value ∫b exceeds the certain threshold value, the coefficient k is saturated at k=1 and thus the interframe integration is not effected. On the other hand, when the detection signal a becomes stable and the integral value ∫b decreases, the coefficient k decreases gradually and the interframe integration begins again.

According to the present embodiment, in the case where the detection signal a varies and it is necessary that the property of following variations has the priority to the increase in the S/N ratio, the coefficient k increases automatically and the degree of integration decreases. In the contrary case, the degree of integration increases automatically. In this way observation under the optimum condition is possible.

Figure 4:
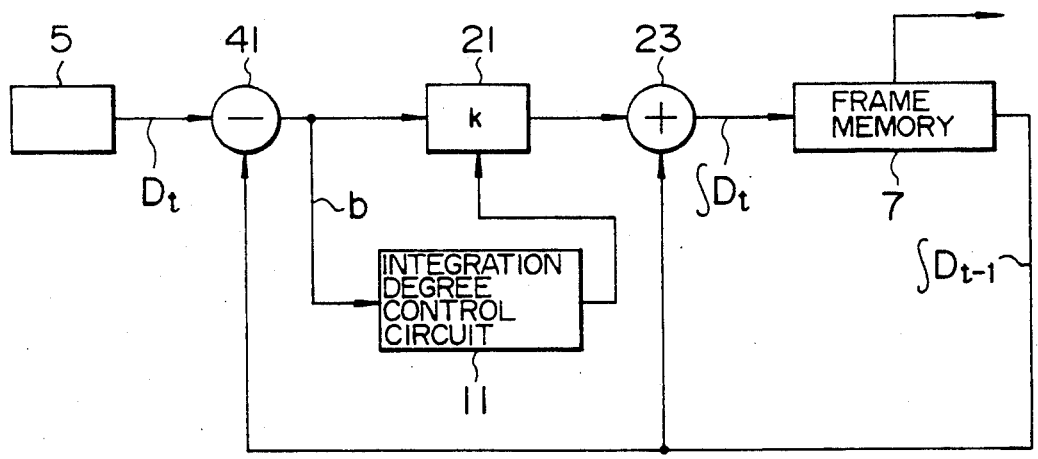
FIG. 4 is a block diagram of an interframe integrating circuit, which is a second embodiment of the present invention.

FIG. 4 is a block diagram showing the construction of the interframe integrating circuit 6 in a second embodiment of the present invention, in which the same reference numerals as those in FIG. 2 represent identical or equivalent items.

In the present embodiment, the image data $\int D_{t-1}$ after the integration is subtracted from the image data $D_t$ in a subtracter 41 and the difference signal b, outputted in response to the value obtained by the subtraction, is inputted in the integration degree control circuit 11. Then, in the same way as described above, the coefficient k is controlled, depending on the integral value ∫b of the difference signal b.

The value obtained by the subtraction described above is attenuated with a gain of k by the attenuator 21 and the image data $\int D_{t-1}$ after the integration is added thereto in the adder 23. Then the image data after the addition is registered in the frame memory as the image data $\int D_t$ after the integration and at the same time is outputted to the D/A converter 8 described previously as the image data at that time.

According to the present embodiment an effect equivalent to that obtained in the preceding embodiment can be realized by using a simpler circuit construction.

However, in the embodiment described above, there may be cases where large noise is inputted, the difference signal b is increased by this noise and the degree of integration is decreased, although it is not necessary.

Further, in the embodiment described above, the circuit construction for detecting the difference signal b is complicated and the device is large and expensive.

Still further, in the embodiment described above, since influences, which the observation condition for a scanning electron microscope such as the magnifying power and the scanning speed excerts on the observed image, are not taken into account, in the practical use there may be following inconveniences.

For example, in general, when the scanning speed is high, the property of following variations in the observed image is good and when the scanning speed is low, the property of following variations in the observed image is bad. Therefore, in the case where the scanning speed is set at a high value, even if the difference signal b increases, a satisfactory property of following variations is obtained without decreasing the degree of integration.

However, in the embodiment described above, since the degree of integration is controlled by using only the value of the difference signal b regardless of the scanning speed, there was a problem that the degree of integration is set at an unnecessarily small value and therefore no satisfactory effect of improving the image quality is obtained.

Therefore, in a following embodiment, an image processing device for a scanning electron microscope is indicated, which can solve this problem to achieve an excellent effect with a simple circuit construction.

Figure 5:
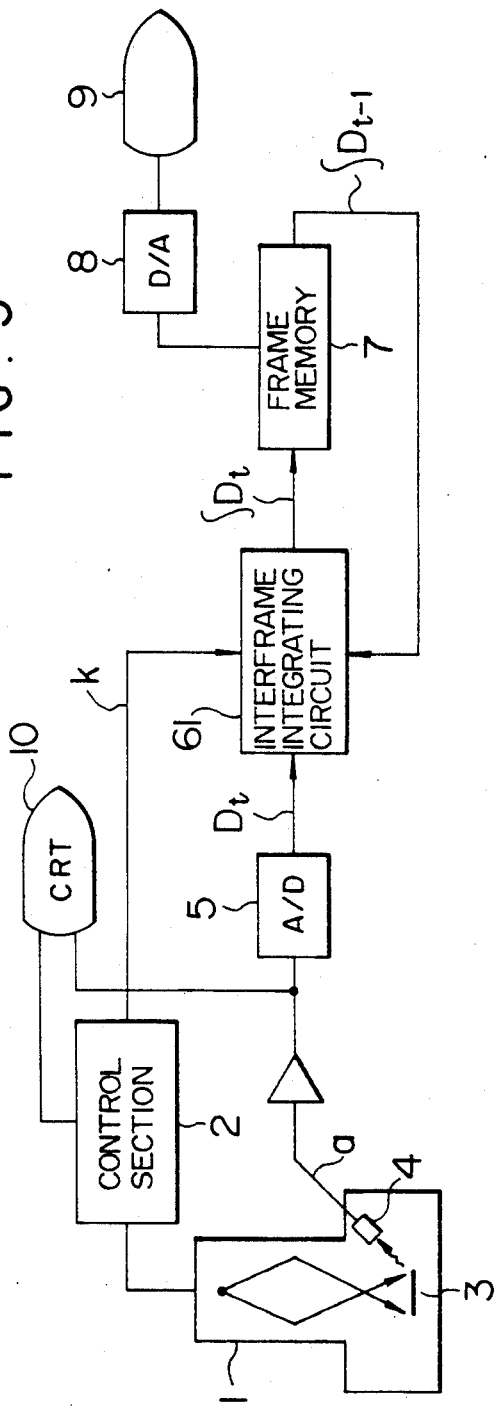
FIG. 5 is a block diagram of an image processing device, which is a third embodiment of the present invention.

FIG. 5 is a block diagram showing the image processing device for a scanning microscope, which is a third embodiment of the present invention, in which the same reference numerals and signs as those indicated in FIG. 1 represent identical or equivalent items.

The control section 2 is constituted usually by a microcomputer and modifications in the observation condition such as the magnifying power, the operation speed, displacement of the sample stage, etc. are effected under the control of the microcomputer. Consequently, the presence or absence of modifications in the observation condition and the amount of the modifications, e.g. the amount of variation in the magnifying power, the amount of displacement of the sample stage, etc., are known for the microcomputer.

Even in the case where the displacement of the sample stage is effected by manual operation, the microcomputer can recognize the presence or absence of the displacement of the sample stage and the amount thereof.

The present embodiment is characterized in that when observation conditions producing variations in the observed image such as the magnifying power of the scanning electron microscope and the position of the sample stage are modified, a signal representing the coefficient k depending on the modifications is outputted from the control section 2 to the interframe integrating circuit 61 and the degree of integration is controlled by the coefficient k.

Figure 6:
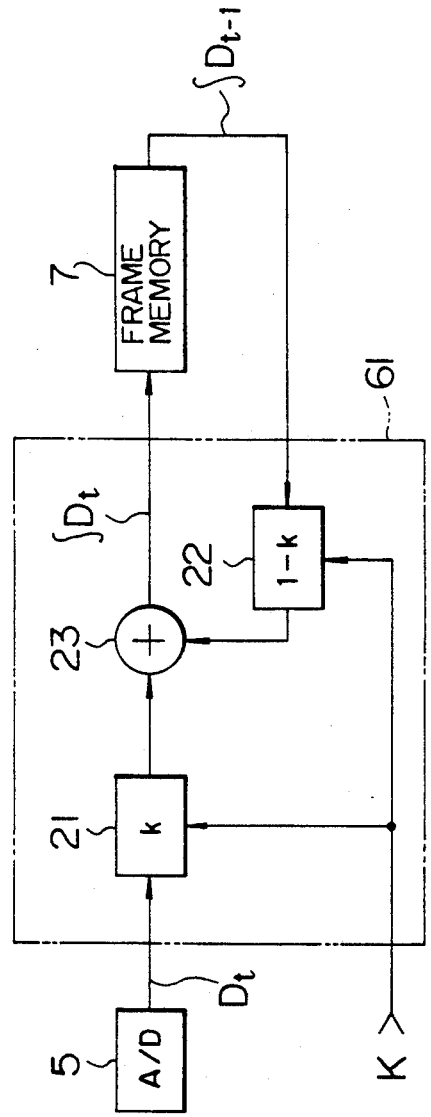
FIG. 6 is a block diagram of an interframe integrating circuit indicated in FIG. 5.

FIG. 6 is a block diagram indicating the construction of the interframe integrating circuit 61, in which the same reference numerals as those used in FIG. 2 represent identical or equivalent items.

In the figure, the image data $D_t$ outputted by the A/D converter 5 is attenuated with a gain of k in the attenuator 21 and the image data $\int D_{t-1}$ after the integration for the directly preceding frame outputted by the frame memory 7 is attenuated with a gain of (1−k) in the attenuator 22.

$k \cdot D_t$ and $(1-k) \cdot \int D_{t-1}$ described above are added in the adder 23, the data after the addition is registered in the frame memory 7 as the new image data $\int D_t$ after the integration, and at the same time is outputted to the D/A converter 8 as the image data at that time. The coefficient k in the attenuators 21 and 22 is controlled by a signal outputted by the control section 2 described previously.

Figure 7:
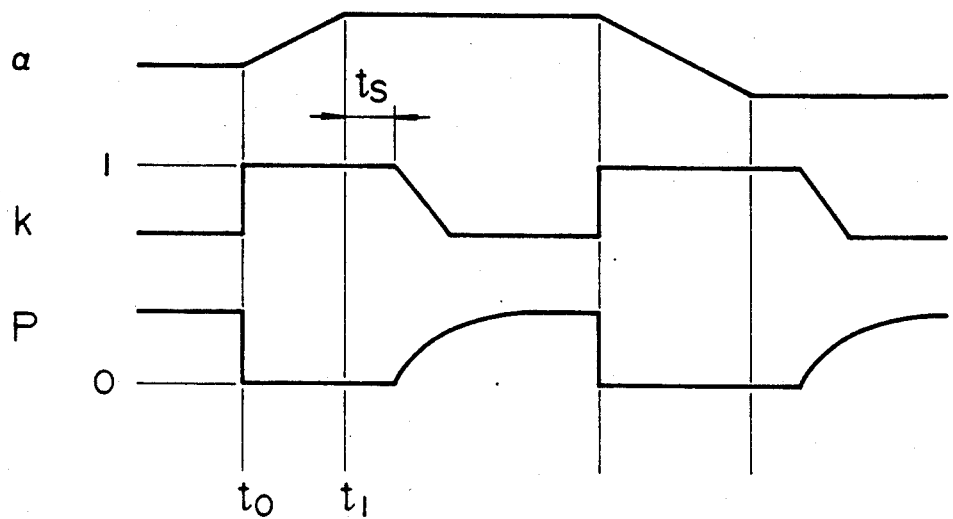
FIG. 7 is a scheme for explaining the function of the circuit indicated in FIG. 6.
Figure 8:
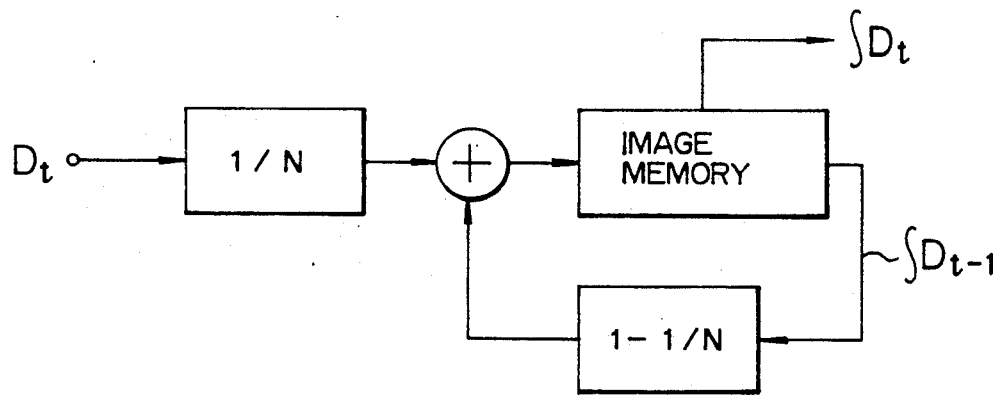
FIG. 8 is a block diagram of a cyclic digital integrating circuit.

FIG. 7 is a scheme indicating the relationship among the detection signal a, the coefficient k set, depending on variations in the detection signal a, and the noise attenuation amount P as the result.

When an operator modifies the magnifying power of the scanning electron microscope, the diaphragm of the condenser lens, the astigmatism, the scanning speed, the gamma connection, the focus adjustment, the position of the sample stage, the irradiation condition with an electron beam, etc., the control section 2 detects it, judges that observation conditions are changed, and sets the coefficient k at 1.

Since the coefficient k is kept at 1 and the input signal is outputted as it is, as far as the modifications described above are being effected, the improvement of the image quality is not performed. Consequently, the observed image varies immediately, following the modifications in the observation condition.

At a point of time $t_1$, when the operator has terminated the operation for the modifications described above, the control section 2 detects it and decreases gradually the coefficient k from 1 with an inclination corresponding to the amount of modifications described above after the lapse of a certain period of time $t_s$. As the result, the improvement of the image quality is effected.

According to the present embodiment, since the degree of integration is not varied, even if the detection signal a is varied by unexpected noise, more precise observation is possible. Further, since the judgment whether the degree of integration should be varied or not is effected by detecting the operation of various sorts of switches for modifying the observation conditions of the scanning electron microscope, the circuit construction is simpler.

Further, according to the present embodiment, in the case where the property of following variations in the observed image is high because of a high scanning speed, by combining observation conditions, such control is possible that the degree of integration is not reduced remarkably, e.g. even if the sample stage is moved.

Apart therefrom, in the case where observation is effected with a high magnifying power, in general, an observation image having a high resolution is demanded in many cases and on the contrary, in the case where observation is effected with a low magnifying power, in many cases the property of following variations is demanded rather than the resolving power as in the case where the observation position should be specified. Therefore, in the case where the magnifying power is set at a high value, such control is possible that the degree of integration is not reduced remarkably, e.g. even if the sample stage is moved.

Further, although the embodiments described above have been explained, supposing that the degree of integration is varied by detecting either one of variations in the detection signal and variations in the observation conditions, control may be effected by combining both the functions.

We claim:

1. An image processing device for use with a scanning electron microscope to improve the image quality of an image of a sample by subjecting image data $D_t$, obtained by irradiating said sample with an electron beam, to interframe integration, comprising:
   integrating means for subjecting successive frames of image data $D_t$ to interframe integration with a determined degree of integration to produce integrated range data $\int D_t$;
   a frame memory connected to said integrating means for storing the integrated image data $\int D_t$ from said integrating means and for supplying integrated image data $\int D_t$ to said integrating means for integration image data $D_t$;
   means for detecting at least one of variations in successive frames of said image data and variations in an observation condition of the electron microscope;
   means for determining said degree of integration of said integration means according to an output of said detecting means; and
   means for displaying an image according to said integrated image data $\int D_t$ stored in said frame memory.

2. An image processing device for an electron microscope according to claim 1, wherein said detecting means operates to detect variations in successive frames of said image data $D_t$ and includes subtracting means for detecting the difference between said image data $D_t$ and said integrated image data $\int D_t$ supplied from said frame memory; and
   said integrating means is constituted by:
   means for outputting a coefficient k corresponding to said difference detected by said subtracting means (where k is a positive number of one or less);
   first multiplying means for multiplying said image data $D_t$ by said coefficient k;
   second multiplying means for multiplying said image data $\int D_t$ received from said frame memory by a coefficient $(1-k)$; and
   means for adding $k \cdot D_t$ and $(1-k) \cdot \int D_t$ produced by said first and second multiplying means to obtain new image data $\int D_t$ for storing in said frame memory.

3. An image processing device for an electron microscope according to claim 1, wherein said detecting means operates to detect variations in successive frames of said image $D_t$ and includes subtracting means for subtracting said image data $\int D_t$ supplied by said frame memory from said image data $D_t$; and
   said integrating means is constituted by:
   means for outputting a coefficient k corresponding to a value obtained by said subtraction means (where k is a positive number of one or less);
   multiplying means for multiplying said value obtained from the subtraction means of said coefficient k; and
   means for adding the product obtained by said multiplying means and said image data $\int D_t$ supplied by said frame memory to obtain new image data $\int D_t$ for storing in said frame memory.

4. An image processing device for an electron microscope according to claim 1, wherein said detecting means variations in the observation conditions, which can produce variations in the observed image of the electron microscope; and
   said integrating means is constituted by:
   first multiplying means for multiplying said image data $D_t$ by a coefficient k corresponding to said variations in observation conditions (where k is a positive number of one or less);
   second multiplying means for multiplying said image data $\int D_t$ supplied by said frame memory by $(1-k)$; and
   means for adding $k \cdot D_t$ and $(1-k) \cdot \int D_t$ produced by said first and second multiplying means to obtain new image data $\int D_t$ for storing in said frame memory.

* * * * *